United States Patent [19]
Roh

[11] Patent Number: 6,071,770
[45] Date of Patent: Jun. 6, 2000

[54] SEMICONDUCTOR MEMORY DEVICE AND METHOD FOR FABRICATING THE SAME

[75] Inventor: Jae Sung Roh, Kyungki-do, Rep. of Korea

[73] Assignee: LG Semicon Co., Ltd., Chungcheongbuk-Do, Rep. of Korea

[21] Appl. No.: 09/079,263

[22] Filed: May 15, 1998

Related U.S. Application Data

[62] Division of application No. 08/788,105, Jan. 23, 1997, Pat. No. 5,828,129.

[30] Foreign Application Priority Data

Sep. 25, 1996 [KR] Rep. of Korea .................. 96/42479

[51] Int. Cl.[7] .................. H01L 21/8234; H01L 21/8242; H01L 21/4763; H01L 21/44; H01L 23/48

[52] U.S. Cl. .................. 438/240; 438/238; 438/647; 438/653; 438/675; 438/685; 438/637; 438/643; 257/296; 257/751; 257/767

[58] Field of Search .................. 438/240, 239, 438/238, 636, 637, 643, 647, 653, 675, 685; 257/296, 532, 751, 754, 767, 774

[56] References Cited

U.S. PATENT DOCUMENTS

| | | | |
|---|---|---|---|
| 5,335,138 | 8/1994 | Sandhu et al. | 361/303 |
| 5,381,302 | 1/1995 | Sandhu et al. | 361/305 |
| 5,418,388 | 5/1995 | Okudaira et al. | 257/295 |
| 5,425,392 | 6/1995 | Thakur et al. | 437/173 |
| 5,436,477 | 7/1995 | Hashizume et al. | 257/310 |
| 5,442,213 | 8/1995 | Okudaira et al. | 257/310 |
| 5,457,069 | 10/1995 | Chen et al. | 437/190 |
| 5,567,964 | 10/1996 | Kashihara et al. | 257/310 |
| 5,608,264 | 3/1997 | Gaul | 257/734 |
| 5,654,567 | 8/1997 | Numata et al. | 257/306 |
| 5,663,591 | 9/1997 | Iranmanesh | 257/530 |
| 5,717,250 | 2/1998 | Schuele et al. | 257/754 |
| 5,858,867 | 1/1999 | Hsia et al. | 438/592 |

*Primary Examiner*—John F. Niebling
*Assistant Examiner*—Ha Tran Nguyen
*Attorney, Agent, or Firm*—Morgan, Lewis & Bockius LLP

[57] ABSTRACT

A semiconductor memory device suitable for forming a capacitor using a high dielectric film for a highly integrated semiconductor device includes a semiconductor substrate, an insulating film having a contact hole, the insulating film being over the semiconductor substrate, a conductive film on the semiconductor substrate through the contact hole, the conductive film having a top portion acting as a diffusion barrier, a first electrode over the conductive films, a dielectric film over the first electrode, and a second electrode over the dielectric film.

17 Claims, 7 Drawing Sheets

SEMICONDUCTOR MEMORY DEVICE AND METHOD FOR FABRICATING THE SAME

"This is a divisional application Ser. No. 08/788,105 filed on Jan. 23, 1997, now U.S. Pat. No. 5,828,129"

BACKGROUND OF THE INVENTION

1. Field of the Invention

The present invention relates to a semiconductor device, and more particularly, to a semiconductor memory device and a method for fabricating the same. Although the present invention is suitable for a wide scope of applications, it is particularly suitable for forming a capacitor using a high dielectric film for a 256 MB DRAM or a higher integrated semiconductor memory device.

2. Discussion of the Related Art

It is desirable to reduce the thickness of the dielectric film to compensate for decreases in the capacitance which results from a decrease in capacitor area due to high packing density, for example. However, a leakage current caused by tunneling effect in the area of thin dielectric layer is often problematic. Such leakage current degrades a reliability of the device.

To avoid such a problem, a storage node in the capacitor is formed with very complicated folded surface to increase an effective area. In addition, a stack of nitride/oxide films is used as the dielectric film to form a thin film capacitor. However, it is difficult to apply the above methods to highly-packed devices such as a 256 MB or higher DRAM because of great step coverage that makes photolithography difficult and fabricating cost too high. To cope with these problems, using a high dielectric layer for the capacitor is suggested to improve capacitance as well as to reduce the complicated folded surface.

$Ta_2O_5$ has been the most researched dielectric material for a capacitor among the many dielectric materials. The researches on the $Ta_2O_5$ were quite successful in forming a thinner film and improving dielectric characteristics and packing density. However, $Ta_2O_5$ is not a better candidate for a capacitor because its dielectric constant is not high enough for higher integrated semiconductor devices. Accordingly, a dielectric material other than $Ta_2O_5$, such as a perovskite type oxide, is of great interest because of its high dielectric constant. Particularly, the perovskite type oxide has become a subject of intensive research for a dielectric film in semiconductor devices.

Examples of the perovskite type oxide include $PZT[Pb(Zr, Ti)O_3]$, $PLZT[(Pb,La)(Zr,Ti)O_3]$, $BST[((Ba,Sr)TiO_3]$, $BaTiO_3$, and SrTiO3. However, these materials tend to have an active chemical reaction with silicon or polysilicon and oxidize storage nodes under a strong oxidating ambient during the fabrication process. Therefore, there are problems yet to be solved in an actual integration process especially in designs and materials to be used for electrodes.

A conventional semiconductor memory device of a high dielectric film and a method for fabricating the same will now be explained with reference to FIG. 1.

Figure 1:
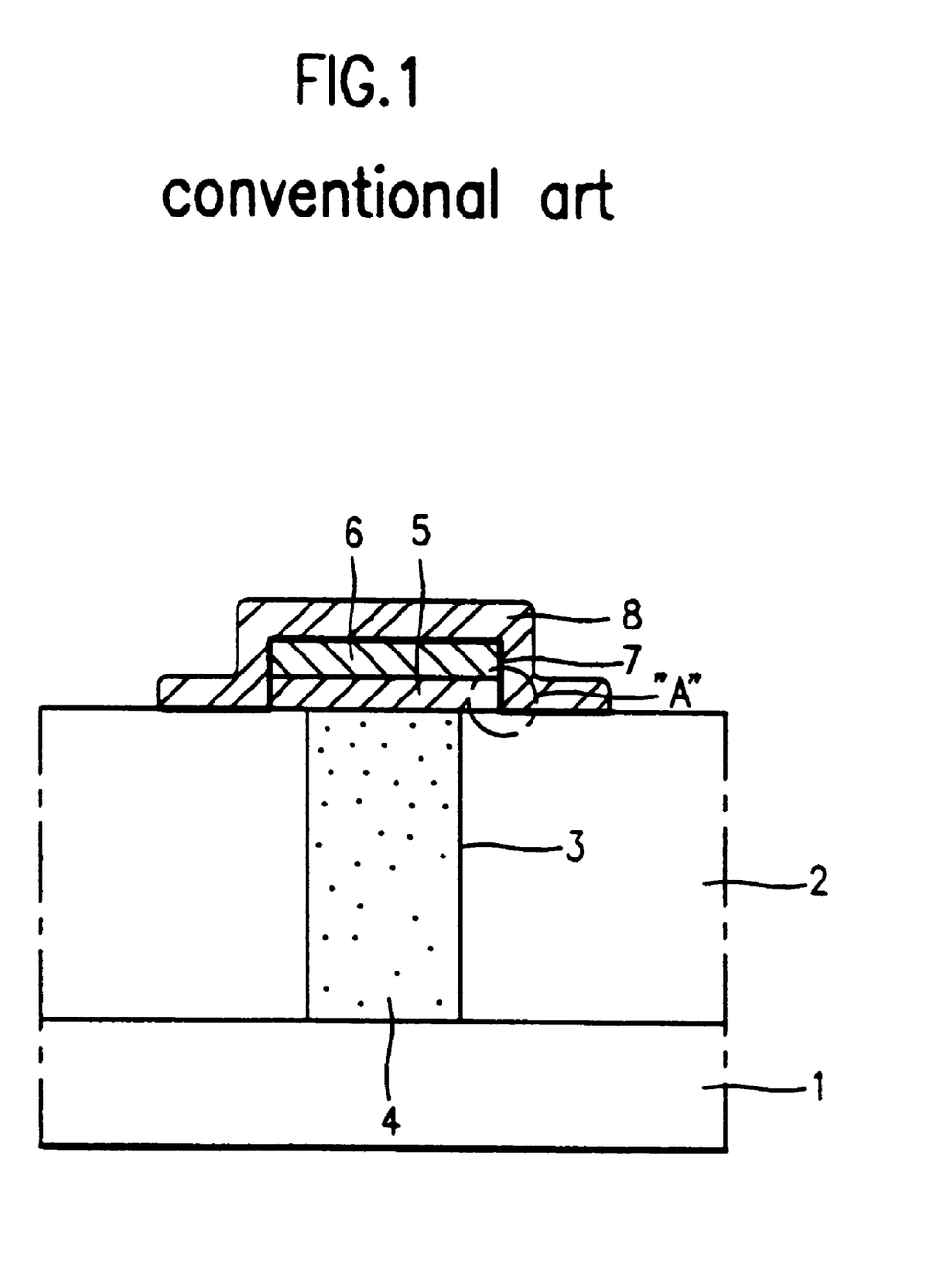
FIG. 1 is a cross-sectional view of a conventional semiconductor memory device.

FIG. 1 is a cross-sectional view of the conventional semiconductor memory device. As shown in FIG. 1, the conventional semiconductor device includes an insulating film 2 having a node contact hole 3 in a semiconductor substrate 1, a source (or drain) region (not shown) on the substrate, a polysilicon plug 4 in the node contact hole 3, a diffusion barrier metal 5 on a top portion of the polysilicon plug 4 and a portion of the insulating film 3, a lower electrode 6 on the diffusion barrier metal 5, a dielectric film 7 on a portion of the insulating film 3 and covering a stack of the lower electrode 6 and the barrier metal 5, and an upper electrode 8 on the dielectric film 7.

A method for fabricating a conventional semiconductor memory device will be explained with reference to FIGS. 2a–2d.

FIGS. 2a–2d are cross-sectional views illustrating the process steps for fabricating a conventional semiconductor device.

Figure 2A:
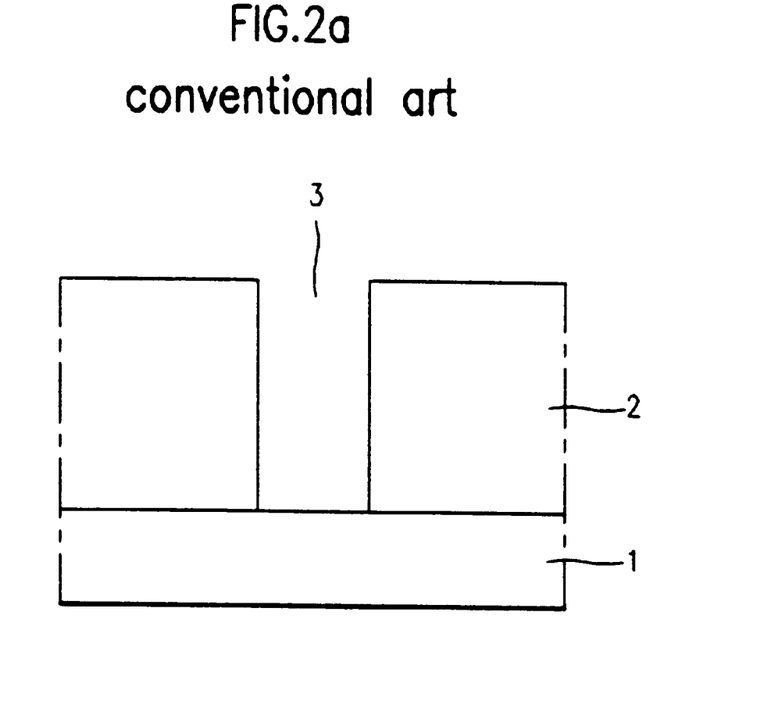
FIGS. 2a–2d are cross-sectional views showing the process steps of fabricating a conventional semiconductor memory device.

Referring to 2a, an insulating film 2 including a gate electrode (not shown) is formed on a semiconductor substrate 1 having a source (or drain) region (not shown), and the insulating film 2 is selectively patterned (by photolithography and etching process) to form a node contact hole 3 contacting the source(or drain) region.

Figure 2B:
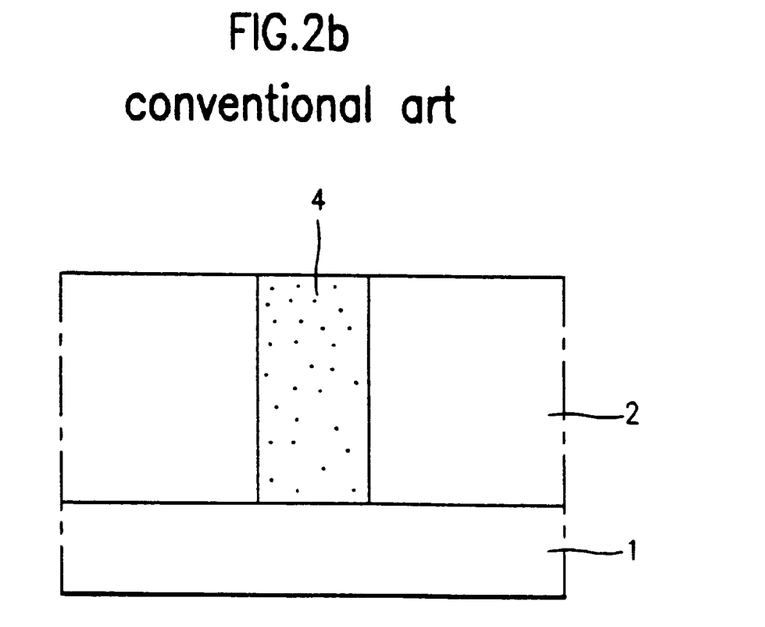

Referring to FIG. 2b, a polysilicon plug 4 is selectively formed in the node contact hole 3.

Figure 2C:
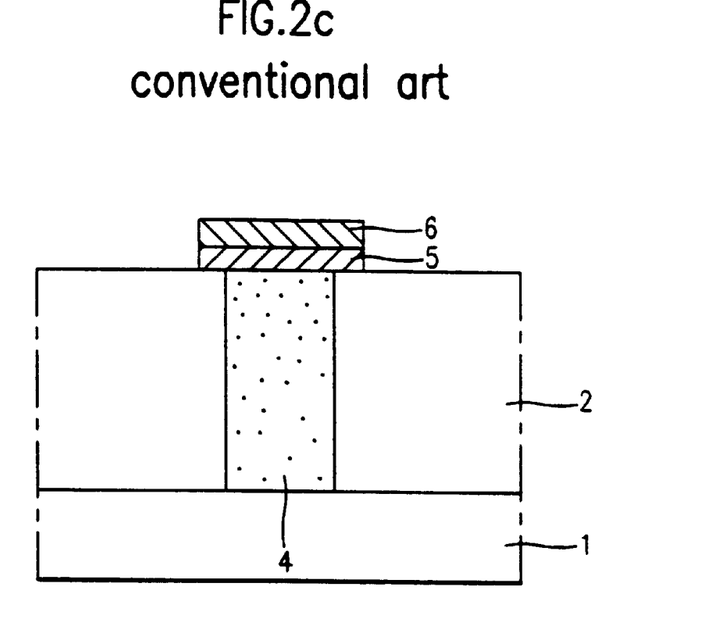

Referring to FIG. 2c, a diffusion barrier metal 5 and a lower electrode 6 are formed on entire surfaces of the polysilicon plug 4 and the insulating film 2. Then, the diffusion metal 5 and the lower electrode 6 are patterned selectively to form an area for a storage node. The barrier metal 5 can be formed from either Tantalum(Ta) or Titanium Nitride(TiN) as a conductive material. If a high strength dielectric film is directly formed on the polysilicon film without the barrier metal, a silicon oxide film is formed at the interface of the high dielectric film and the polysilicon film. The barrier metal prevents the silicon from diffusing into the lower electrode used as the storage node. A diffused silicon increases an inherent resistance of the lower electrode and forms a thin oxide film on the upper portion of the lower electrode, thereby degrading performance of the high dielectric film. Thus, for the purpose of preventing the aforementioned disadvantages, the barrier metal is formed between the lower electrode 6 and the polysilicon plug 4. Also, a platinum electrode is used as the lower electrode 6 to suppress a leakage current.

Figure 2D:
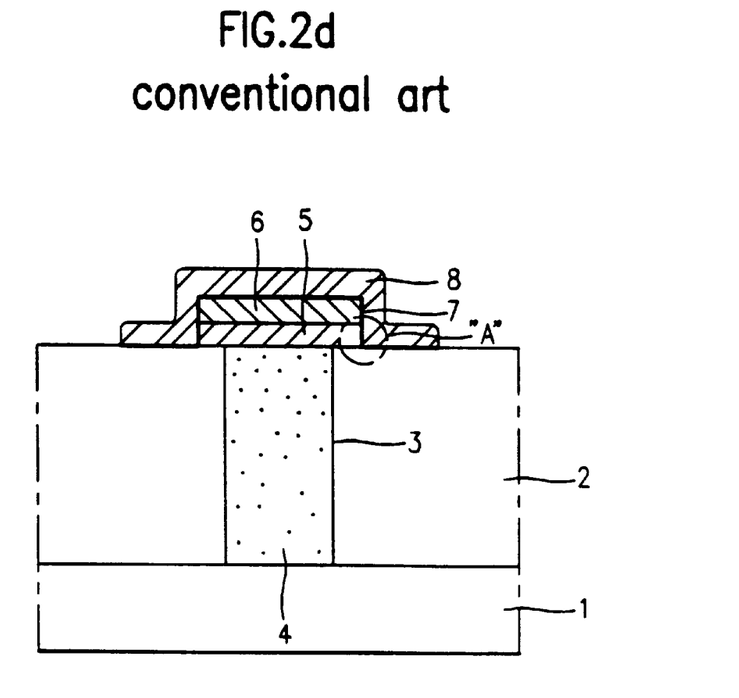

Referring to FIG. 2d, the high dielectric film is formed on a stacked surface of the lower electrode 6 and the barrier metal 5. Then, an upper electrode 8 is formed on an entire surface of the high dielectric film to form a capacitor in the conventional semiconductor memory device. The high dielectric film includes a material having a high dielectric constant such as a PZT $[Pb(Zr,Ti)O_3]$ and a BST $[(Ba,Sr)TiO_3]$.

In the aforementioned conventional semiconductor memory device, a high dielectric film (for example, a BST having a dielectric constant of about 2000) is used together with the platinum electrode which suppresses leakage current so that a good device characteristics is achieved in semiconductor memory devices, particularly in a 256 MB or higher DRAM.

Although the barrier metal between the lower electrode and the polysilicon plug prevents the silicon from diffusing into the lower electrode, sides of the barrier metal in contact with the high dielectric film provide paths for a leakage current. Therefore, even if the barrier metal is formed on the polysilicon plug, there is still a reliability problem in integrated semiconductor memory devices with high packing density such as a 256 MB or higher DRAM.

SUMMARY OF THE INVENTION

Accordingly, the present invention is directed to a semiconductor memory device and a method for fabricating the same that substantially obviates one or more of problems due to limitations and disadvantages of the related art.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a semiconductor memory device includes a semiconductor substrate, an insulating film over the semiconductor substrate and having a contact hole, a conductive film on the semiconductor substrate through the contact hole, the conductive film having a portion acting as a diffusion barrier, a first electrode over the conductive film, a dielectric film over the first electrode, and a second electrode over the dielectric film.

In another aspect of the present invention, the semiconductor memory device includes a semiconductor substrate, an insulating film on the semiconductor substrate and having a contact hole, a first conductive film through the hole, a second conductive film on the first conductive film through the contact hole, a diffusion barrier on the semiconductor substrate, a first electrode on the diffusion barrier, a dielectric film on the first electrode, and a second electrode on the dielectric film.

In a another aspect of the present invention, the semiconductor memory device includes a semiconductor substrate, an insulating film having a contact hole, the insulating film being on the semiconductor substrate, a polysilicon layer on the semiconductor substrate through the contact hole, a tungsten layer on the polysilicon layer, a titanium tungsten layer on the tungsten layer and partly projects from the contact hole, a platinum layer on an exposed surface of the titanium tungsten layer and a portion of the insulating layer, a dielectric layer on an exposed surface of the platinum layer and a portion of the insulating layer, and a second electrode acting as a plate node on the exposed surface of the dielectric layer In another aspect of the present invention, a method for fabricating a semiconductor memory device having a capacitor on a semiconductor substrate, the method includes the steps of forming an insulating film having a contact hole, forming a conductive film on the semiconductor substrate through the contact hole, forming a diffusion barrier having a portion in the contact hole, the diffusion barrier formed on the conductive film, forming a first electrode on the diffusion barrier, forming a dielectric film on the first electrode and on the insulating film, and forming a second electrode on the dielectric film.

In another aspect of the present invention, the method includes the steps of forming an insulating film on the semiconductor substrate, patterning the insulating film to form a contact hole therein, forming a first conductive film on the semiconductor substrate through the contact hole, forming a second conductive film directly from a portion of the first conductive film, forming a third conductive film on the second conductive film and on the insulating film, forming a diffusion barrier from a portion of the second conductive film and a portion of the third conductive film, removing a portion of the third conductive film other than the diffusion barrier, forming a first electrode on the diffusion barrier and on the insulating film, forming a dielectric film on the first electrode and on the insulating film, and forming a second electrode on the dielectric film.

In a further aspect of the present invention, the method includes depositing an insulating film on the semiconductor substrate, patterning the insulating film to form a contact hole therein, depositing a polysilicon film on the semiconductor substrate and on the insulating film, removing the polysilicon film on the insulating film, exposing a portion of the polysilicon film to a $WF_6$ gas, substituting the portion of the polysilicon film with a tungsten film, forming a titanium film on the tungsten film and on the insulating film, annealing the titanium film and the tungsten film, substituting a portion of the titanium film and the tungsten layer with a titanium tungsten film, removing the titanium film on the insulating film and on the titanium tungsten film, depositing a platinum film on the titanium tungsten film and on the insulating film, patterning the platinum film to cover an exposed titanium tungsten film, depositing a dielectric film on the platinum film and on the insulating film, patterning the dielectric film to cover an exposed platinum layer, depositing an electrode on the dielectric film and on the insulating film, and patterning the electrode to cover an exposed dielectric film.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
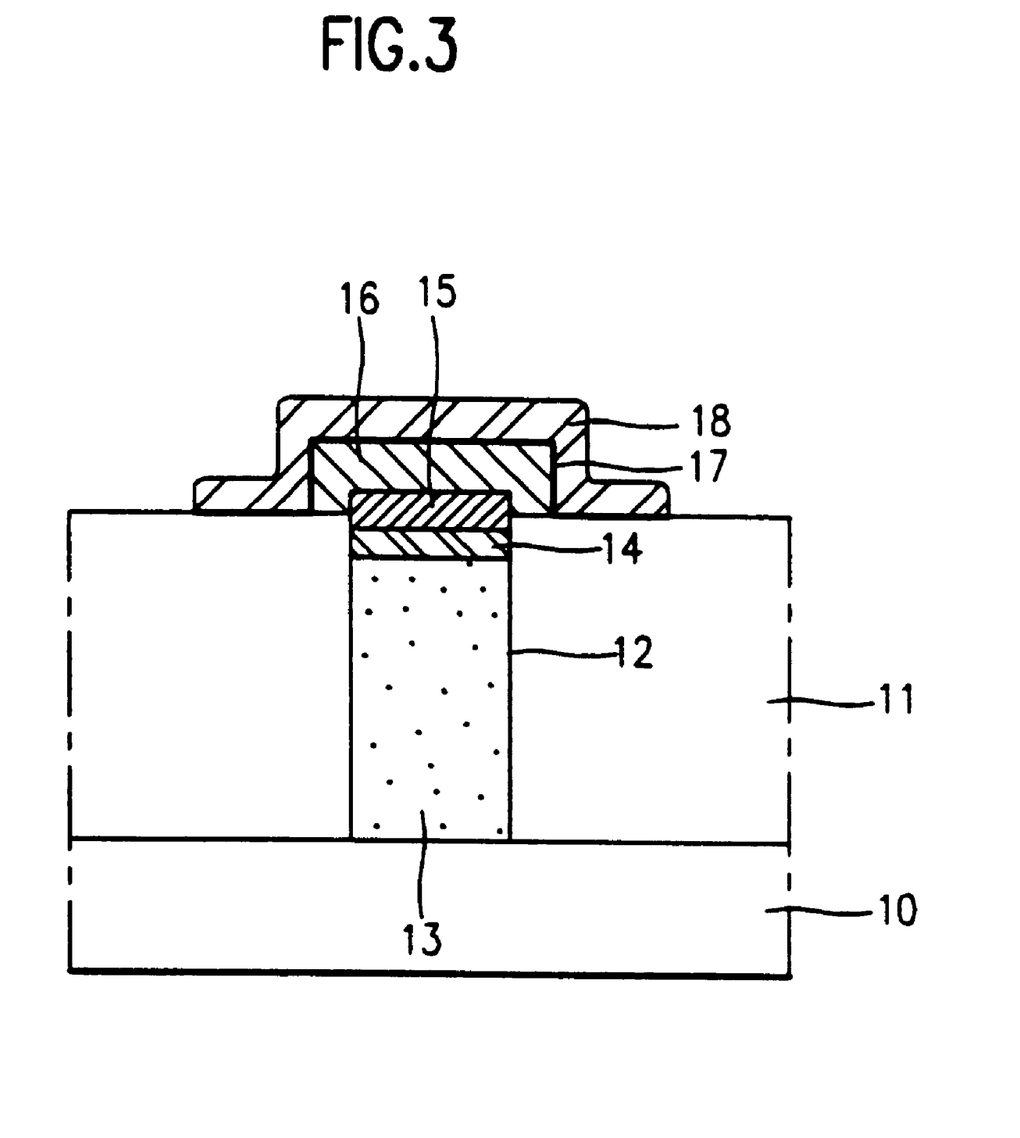
FIG. 3 is a cross-sectional view of a semiconductor memory device in accordance with a preferred embodiment of the present invention.

Referring to FIG. 3, an insulating film 11 having a node contact hole 12 is formed on a semiconductor substrate 10 having a source(or drain) region formed therein, and a first conductive film, for example, a polysilicon plug 13, is formed in the node contact hole 12. The polysilicon plug 13 is formed in the node contact hole 12 over a source (or drain) region (not shown). A second conductive film, for example, a tungsten plug 14, is formed on the polysilicon plug 13. The tungsten plug 14 is formed in the node contact hole 12 and on the polysilicon plug 13. A diffusion barrier, for example, a TiW film 15, is formed on the tungsten plug 14. The TiW film 15 acts as a barrier metal which prevents silicon in the polysilicon plug 13 from diffusing into a lower electrode 16. The TiW layer 15 is partially formed in the node contact hole 12 and extends out of the node contact hole 12. The lower electrode 16 is used as a storage node and formed on a portion of the insulating film 11 including the TiW layer 15. A high dielectric film 17 formed on the exposed surface of the lower electrode 16. The lower electrode 16 is formed from platinum and suppresses leakage current. A high dielectric film 17 is formed from one of PZT[Pb(Zr,Ti)O$_3$], PLZT[(Pb,La) (Zr,Ti)O$_3$], BST[(Ba,Sr)TiO$_3$], BaTiO$_3$, and SrTiO$_3$. An upper electrode 18 used as a plate node is formed to cover an entire surface of the dielectric film 17.

A method for fabricating the semiconductor memory device in accordance with a preferred embodiment of the present invention will now be described in detail.

FIGS. 4a–4f are cross-sectional views of the present invention in the process steps of fabricating the semiconductor memory device having a capacitor.

Figure 4A:
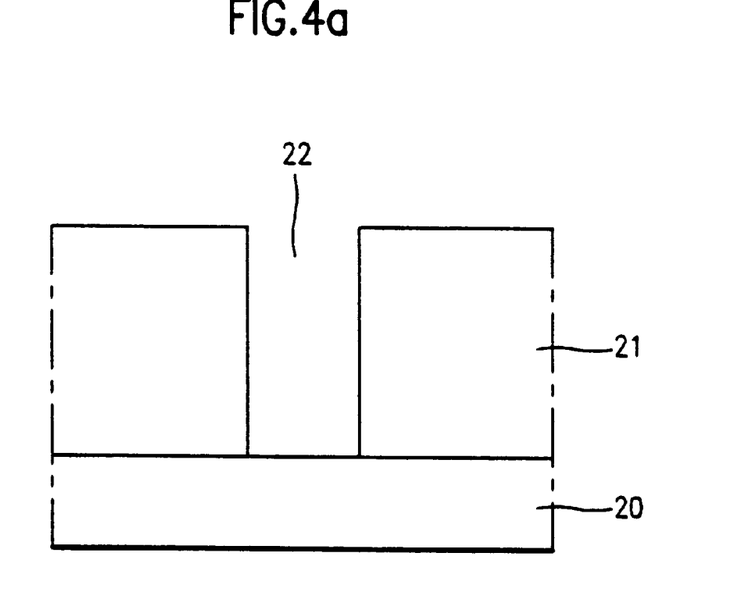
FIGS. 4a–4f are cross-sectional views showing the process steps of fabricating a semiconductor memory device having a capacitor in accordance with a preferred embodiment of the present invention.

Referring to FIG. 4a, an insulating film 21 including a gate electrode (not shown) is formed on a semiconductor substrate 20 having a source (or drain) region (not shown), and the insulating film is selectively patterned(by photolithography and etching process, for example) to form a node contact hole 22 over a source (or drain) region (not shown).

Figure 4B:
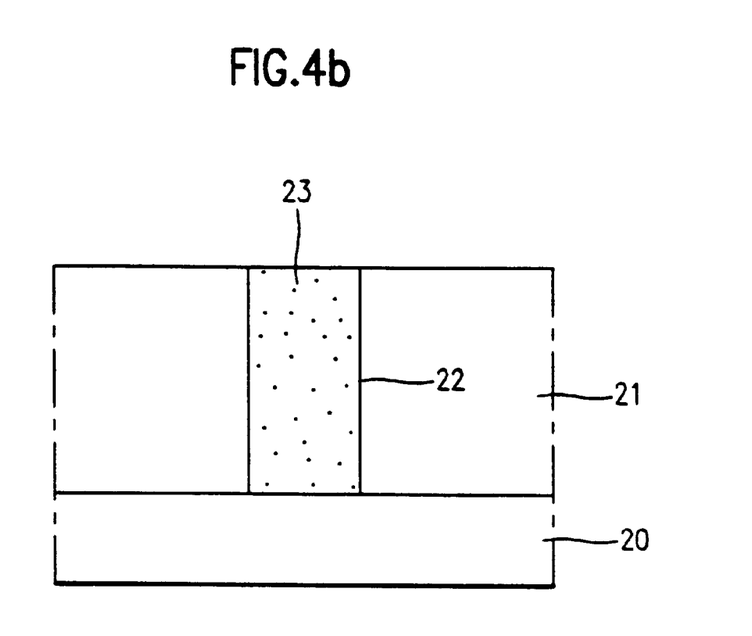

Referring to FIG. 4b, a first conductive film, for example, a polysilicon plug 23, is formed in the node contact hole 22. The first conductive film is formed on the semiconductor substrate 20 through the node contact hole 22.

Figure 4C:
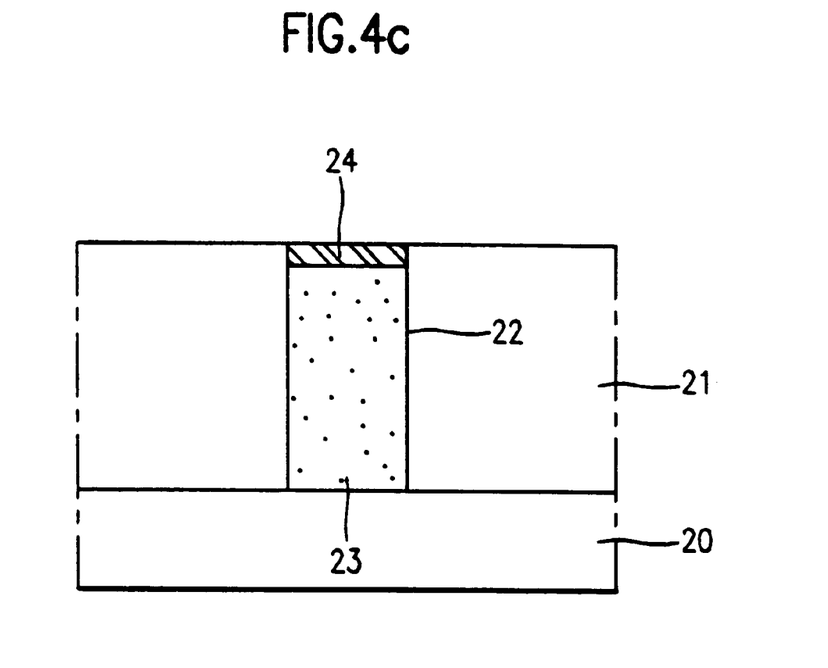

Referring to FIG. 4c, the polysilicon plug 23 is exposed to a WF$_6$ gas. Then, according to a chemical reaction of $2WF_6+3Si \rightarrow 2W+3SiF_4$, a second conductive film, for example, tungsten (W) plug 24 is formed at an upper portion of the polysilicon plug 23. Alternatively, a selective tungsten plug deposition method may be used in the present invention instead of the tungsten plug forming method using the above chemical reaction. Thus, the polysilicon plug 23 is formed to have a predetermined thickness in the node contact hole 22, and then tungsten is introduced or buried selectively to form the tungsten plug 24.

Figure 4D:
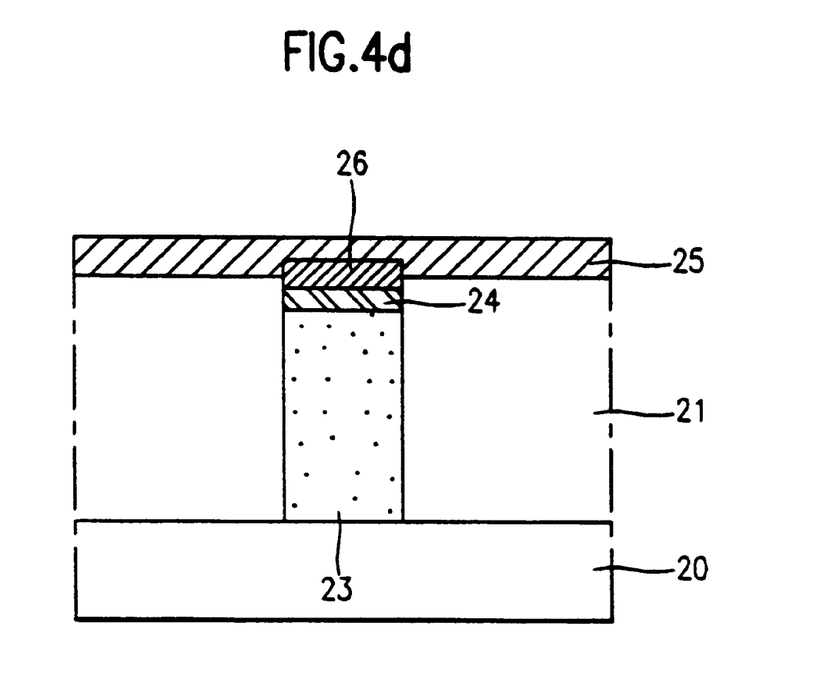

Referring to FIG. 4d, a third conductive film, for example, a Ti layer 25, is deposited on the insulating film 21 including the tungsten plug 24. Then, the third conductive film and the second conductive film are annealed to form a diffusion barrier, for example, a TiW layer 26, between the third conductive film (the Ti layer 25), and the second conductive film (the tungsten plug 24). The TiW layer 26 acts as a barrier metal which prevents silicon in the polysilicon plug 23 from diffusing into a lower electrode 27 (shown in FIG. 4f).

Figure 4E:
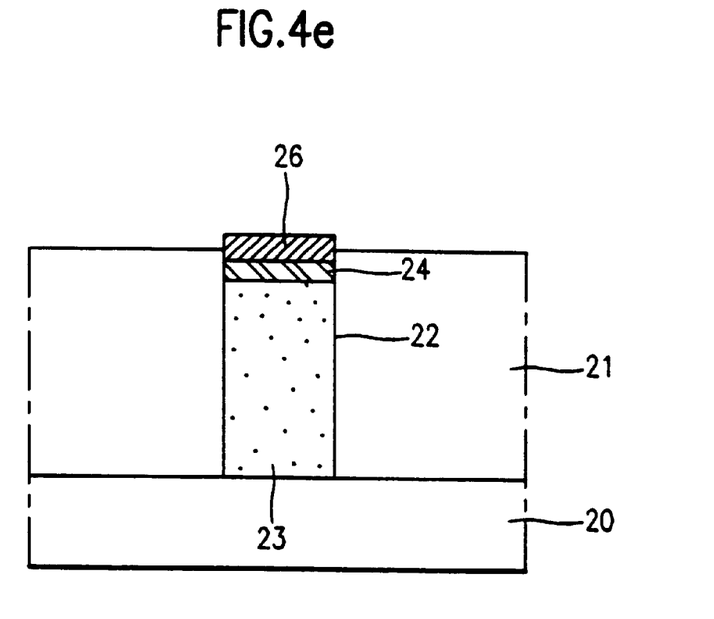

Referring to FIG. 4e, Ti layer 25 is removed and the TiW layer 26 remains. In this process, for example, NH$_4$OH: H$_2$O$_2$: H$_2$O solution is used to remove the Ti layer 25. A lower portion of the diffusion barrier (the TiW layer 26) is preferably formed in the node contact hole 22 and an upper portion of the TiW layer 26 extends out from the node contact hole 22.

Figure 4F:
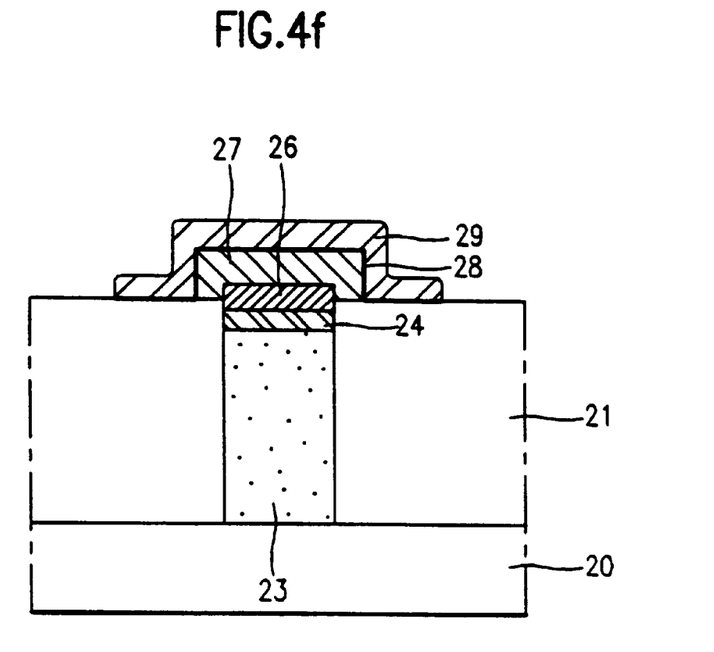

Referring to FIG. 4f, lower electrode 27 is formed on a portion of the exposed surface of the insulating film 21 including the TiW layer 26 and patterned by photolithography and etching process to be used as a storage node region. A high dielectric film 28 is formed on the surface of the lower electrode 27. The lower electrode 27 is formed from platinum (Pt) which is known to minimize leakage current generation. The high dielectric film 28 is preferably formed from one of PZT [Pb(Zr,TiO)$_3$], PLZT [(Pb,La) (Zr,Ti)O$_3$)], BST [(Ba,Sr)TiO$_3$], BaTiO$_3$, and SrTiO$_3$. An upper electrode 29 is formed on the high dielectric film 28 and patterned selectively to be used as a plate node. Accordingly, the semiconductor memory device having a capacitor of the present invention is formed.

As described above, the TiW layer as a barrier metal that prevents the silicon in the polysilicon plug from diffusing into the lower electrode is partly buried in the node contact hole and completely covered by the lower electrode. In effect, the lower electrode is completely isolated from the polysilicon so that the TiW layer does not contact the high dielectric film. Therefore, the semiconductor device of the present invention has an advantage of improving the reliability of a 256 MB DRAM or other highly integrated semiconductor memory devices by suppressing leakage current in the capacitor.

It will be apparent to those skilled in the art that various modification and variations can be made in the method for fabricating a semiconductor memory device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor memory device having a capacitor on a semiconductor substrate, the method comprising the steps of:

forming an insulating film having a contact hole over the semiconductor substrate;

forming a first conductive layer on the semiconductor substrate through the contact hole;

forming a diffusion barrier having a first portion within the contact hole and a second portion extending out from the contact hole and having a width the same as the contact hole, the diffusion barrier being formed on the first conductive layer;

forming a first electrode on the diffusion barrier the first electrode completely covering an exposed portion of the diffusion barrier;

forming a dielectric film on the first electrode and on the insulating film; and forming a second electrode on the dielectric film.

2. The method according to claim 1, wherein the step of forming the conductive film includes the steps of:

forming a first conductive layer on the semiconductor substrate; and forming a second conductive layer on the first conductive layer.

3. The method according to claim 1, wherein the step of forming the diffusion barrier includes the step of:

forming a second conductive layer on the first conductive layer forming a third conductive layer on the second conductive layer; and forming the diffusion barrier from a portion of the second conductive layer and a portion of the third conductive layer.

4. The method according to claim 1, wherein the step of forming the second conductive layer includes the step of forming the second conductive layer directly from a portion of the first conductive layer.

5. A method for fabricating a semiconductor memory device having a capacitor on a semiconductor substrate, the method comprising the steps of:

forming an insulating film on the semiconductor substrate;

patterning the insulating film to form a contact hole therein;

forming a first conductive film on the semiconductor substrate through the contact hole;

forming a second conductive film directly from a portion of the first conductive film;

forming a third conductive film on the second conductive film and on the insulating film;

forming a diffusion barrier from a portion of the second conductive film and a portion of the third conductive film, the diffusion barrier having a first portion within the contact hole and a second portion extending out from the contact hole and having a width the same as the contact hole;

removing the third conductive film leaving the diffusion barrier;

forming a first electrode on the diffusion barrier and on the insulating film, the first electrode completely covering an exposed portion of the diffusion barrier;

forming a dielectric film on the first electrode and on the insulating film; and forming a second electrode on the dielectric film.

6. The method according to claim 5, wherein the step of forming the first conductive film includes the steps of:

depositing the first conductive film on the semiconductor substrate and on the insulating film; and removing a portion of the first conductive film deposited on the insulating film.

7. The method according to claim 5, wherein the step of forming the second conductive film includes the step of exposing the first conductive film to a $WF_6$ gas to transform a portion of the first conductive film to the second conductive film.

8. The method according to claim 5, wherein the step of forming the diffusion barrier includes the step of annealing the third conductive film and the second conductive film to transform portions of the third conductive film and the second conductive film to the diffusion barrier.

9. The method according to claim 5, wherein the third conductive film is formed with a material including titanium.

10. The method according to claim 5, wherein the step of removing the third conductive film includes the step of wet etching the third conductive film using an $NH_4OH:H_2O_2:H_2O$ solution.

11. The method according to claim 5, wherein the first electrode is formed with a material including platinum.

12. The method according to claim 5, wherein the dielectric film is formed with a material including at least one of PZT, PLZT, BST, $BaTiO_3$, and $SrTiO_3$.

13. The method according to claim 5, wherein the first conductive film is formed with a material including polysilicon.

14. The method according to claim 5, wherein the second conductive film is formed with a material including tungsten.

15. A method for fabricating a semiconductor memory device having a capacitor on a semiconductor substrate, the method comprising the steps of:

depositing an insulating film on the semiconductor substrate;

patterning the insulating film to form a contact hole therein;

depositing a polysilicon film on the semiconductor substrate and on the insulating film;

removing the polysilicon film on the insulating film;

transforming a portion of the polysilicon film to a tungsten film;

forming a titanium film on the tungsten film and on the insulating film;

annealing the titanium film and the tungsten film to form a titanium tungsten film;

removing a portion of the titanium film on the insulating film and on the titanium tungsten film, wherein the titanium tungsten film has a first portion within the contact hole and a second portion extending out from the contact hole and having a width the same as the contact hole;

depositing a platinum film on the titanium tungsten film and the insulating film;

patterning the platinum film to cover completely an exposed titanium tungsten film;

depositing a dielectric film on the platinum film and the insulating film;

patterning the dielectric film to cover an exposed platinum layer;

depositing a second electrode on the dielectric film and the insulating film; and patterning the second electrode to cover an exposed dielectric film.

16. The method according to claim 15, wherein the dielectric film in the step of depositing the dielectric film includes at least one of PZT, PLZT, BST, $BaTiO_3$, and $SrTiO_3$ layer.

17. The method according to claim 15, wherein the transforming step includes the step of exposing the portion of the polysilicon film to $WF_6$ gas.

* * * * *